(12) United States Patent
Kao

(10) Patent No.: US 6,844,835 B2
(45) Date of Patent: Jan. 18, 2005

(54) DAC CELL CIRCUIT

(75) Inventor: Hsueh-Wu Kao, Hsin Chu (TW)

(73) Assignee: MediaTek Inc., Hsin Chu (TW)

( * ) Notice: Subject to any disclaimer, the term of this patent is extended or adjusted under 35 U.S.C. 154(b) by 0 days.

(21) Appl. No.: 10/609,569

(22) Filed: Jul. 1, 2003

(65) Prior Publication Data
US 2004/0004511 A1 Jan. 8, 2004

(30) Foreign Application Priority Data
Jul. 8, 2002 (TW) .................................. 91115374 A

(51) Int. Cl.[7] .............................................. H03M 1/66
(52) U.S. Cl. ...................................... 341/136; 341/153
(58) Field of Search ................................ 341/136, 144, 341/153

(56) References Cited

U.S. PATENT DOCUMENTS

| | | | | |
|---|---|---|---|---|
| 4,551,709 A | * | 11/1985 | Merchant et al. ............ | 341/136 |
| 4,635,038 A | * | 1/1987 | Wincn ......................... | 341/136 |
| 5,254,994 A | * | 10/1993 | Takakura et al. ............ | 341/153 |
| 5,446,457 A | * | 8/1995 | Ryat ............................ | 341/136 |
| 5,631,647 A | * | 5/1997 | Huang ......................... | 341/136 |
| 5,838,271 A | * | 11/1998 | Park ............................ | 341/144 |
| 6,031,366 A | * | 2/2000 | Mitsuishi .................... | 341/153 |
| 6,160,507 A | * | 12/2000 | Carbou et al. .............. | 341/144 |

* cited by examiner

Primary Examiner—Howard L. Williams
(74) Attorney, Agent, or Firm—Birch, Stewart, Kolasch & Birch, LLP

(57) ABSTRACT

A digital-analog converter (DAC) cell circuit. The circuit includes a current source, a first resistor, a second resistor, a first MOSFET, a second MOSFET, a third MOSFET and a forth MOSFET. The first MOSFET has a source and a drain connected to the current source and the first resistor, respectively, and a gate receiving a first control signal. The second MOSFET has a source and a drain connected to the current source and the second resistor, respectively, and a gate receiving a second control signal. The third MOSFET has a source and a drain connected to the source and drain of the first MOSFET, respectively, and a gate receiving a third control signal. The fourth MOSFET has a source and a drain connected to the source and drain of the second MOSFET, respectively, and a gate receiving a fourth control signal. The third control signal is a signal delayed of the first signal and the forth control signal is a signal delayed of the second signal. The delayed control signal can be used to control the slew rate of current DAC cell, thus reduce the package inductance induced L di/dt noise. Also it can be used to reduce the voltage fluctuations during current switching so as to get fast settling current.

6 Claims, 3 Drawing Sheets

DAC CELL CIRCUIT

BACKGROUND OF THE INVENTION

1. Field of the Invention

The invention relates to a semiconductor integrated circuit, and more particularly, to a current DAC (Digital-Analog Converter) cell circuit, which can reduce the voltage fluctuations during current switching so as to make the output voltage reaching stable quickly. Also we can reduce the current spike when large current switching instantaneously by controlling the slew rate of output current.

2. Description of the Related Art

Recently, owing to the enhancing efficiency of the microprocessor for the personal computer, the demands for image processing are getting higher. Consequently, the digital-to-analog converters (DACs) are getting more important for the image display. However, when the operation frequency of the microprocessor is getting higher, the demands for the precision and speed of the DAC are getting stricter. It is quite important to perform digital-to-analog conversion with fast settling and high accuracy.

FIG. 1 is a conventional current-type DAC cell circuit. Referring to FIG. 1, the DAC cell circuit includes a PMOSFFT 11 and a pair of PMOSFETs 12 and 13. The PMOSFET 11 serves as a constant current source to provide a constant current Is for the DAC cell circuit and is controlled by an input signal Vbp with constant voltage. The pair of PMOSFETs 12 and 13 serves as a current switch pair and the sources of the PMOSFETs 12 and 13 are both connected to the drain of the PMOSFET 11, and the drains of the PMOSFETs 12 and 13 are connected to resistors 14 and 15, respectively. The switching operations of the PMOSFETs 12 and 13 are controlled by the control signals Q and QB, which are input to the gates of the PMOSFETs 12 and 13, respectively. The control signal QB is the logic reverse signal of the control signal Q. The switches are PMOSFETs, which are low active. When the control signal Q is low, the DAC cell circuit outputs an analog current and the current signal is translated to output voltage through resistor 14. And when the control signal Q is high then the control signal QB is low, the DAC cell circuit outputs an analog current to the dummy load resistor 15. The control signals Q and QB are a pair of control signals with non-overlap timing control, as shown in FIG. 2.

The operation principle of the DAC cell circuit in FIG. 1 is described as follows. When DAC cell current is switched from dummy load to output, the control signal Q is changed from High to Low, the current I2 flowing trough the PMOSFET 12 is changed from 0 to Is. In order to avoid reducing speed of the DAC cell circuit during switching, it is necessary to use the control signals with non-overlap timing control, for example the control signals Q and QB as shown in FIG. 2. The non-overlap timing control means that one switch must be turned on 1$^{st}$ and the other switch then can be turned off. The PMOSFET 12 is turned ON first, and next the PMOSFET 13 is turned OFF, and then the current I2 flowing through the PMOSFET 12 is changed from 0 to Is. If the control signals Q and QB are not non-overlap timing signals, the PMOSFETs 12 and 13 of the switch pair may be turned off simultaneously during the current switching. Then, the voltage Vcs of the common source node of the switch pair is instantly pulled toward voltage Vcc through the PMOSFET 11. The unnecessary error circuit operation makes the transistor 11 be turned off. Therefore, the DAC cell circuit has to spend additional time to discharge the voltage Vcs at the common source node from Vcc to a stable potential. This may limit the operation speed of the DAC cell circuit, and thus it is necessary to use the control signals with non-overlap timing control.

However, even if the DAC cell circuit is controlled by the control signals with non-overlap timing control, voltage fluctuation at the common source node in the switch pair of the DAC cell circuit may still exist. This is because the operation method using the control signals with non-overlap timing control has to ensure that the PMOSFETs 12 and 13 of the switch pair cannot be turned off simultaneously. That is, one of the PMOSFETs has to be turned on and then the other PMOSFET can be turned off. At that moment when the two PMOSFETs 11, 12 are simultaneously turned on, the current flowing through the PMOSFETs 11, 12 is only equal to one half of current of the constant current source. The gate-source voltage $V_{GS}$ of the two PMOSFETs is smaller than the gate-source voltage $V_{GS}$ when one PMOSFET is turned on. This may still cause the voltage vibration at the common source node, thereby limiting the operation speed of the DAC cell circuit, as shown in FIG. 2.

SUMMARY OF THE INVENTION

In view of the above-mentioned problems, the invention provides a DAC cell circuit, which is capable of quickly settling the output current using control signals without non-overlap timing control. Also, the DAC cell circuit minimizes the common source node Vcs voltage vibration during current switching process by way of optimum timing control. Also the slew rate of the output current can be controlled by the same timing scheme.

To achieve the above-mentioned object, the DAC cell circuit of the invention includes a constant current source for providing a constant current, a first resistor, a second resistor, a first MOSFET, a second MOSFET, a third MOSFET and a fourth MOSFET. The first MOSFET has a source connected to the constant current source, a drain connected to the first resistor, and a gate for receiving a first control signal. The second MOSFET has a source connected to the constant current source and the source of the first MOSFET, a drain connected to the second resistor, and a gate for receiving a second control signal. The third MOSFET has a source and a drain connected to the source and drain of the first MOSFET, respectively, and a gate for receiving a third control signal. The fourth MOSFET has a source and a drain connected to the source and drain of the second MOSFET, respectively, and a gate for receiving a fourth control signal.

The second control signal is a logic reverse signal: of the first control signal, the third control signal is a delayed signal of the first control signal, and the fourth control signal is a logic reverse signal of the third control signal.

DETAILED DESCRIPTION OF THE INVENTION

Figure 1:
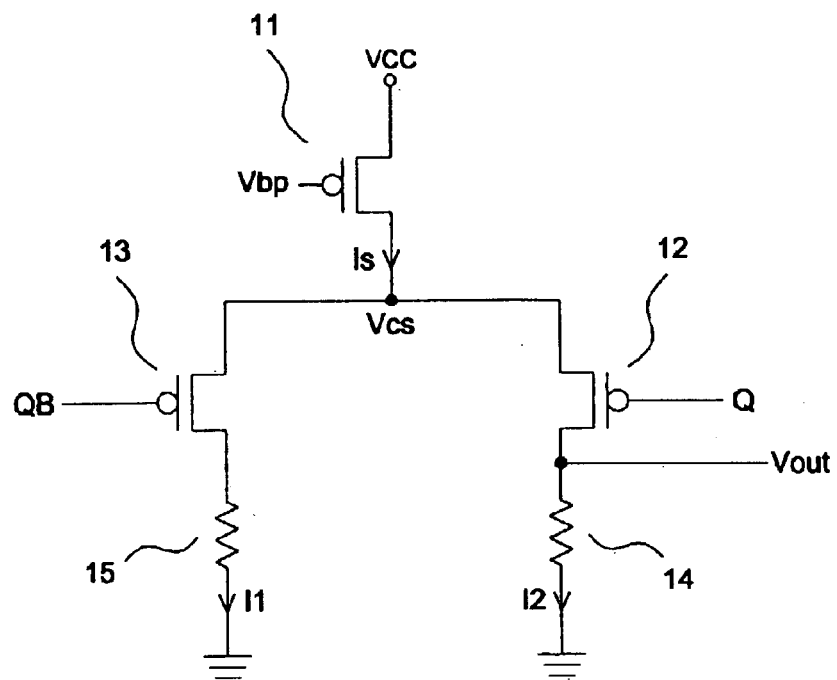
FIG. 1 shows a conventional current-type DAC cell circuit.
Figure 2:
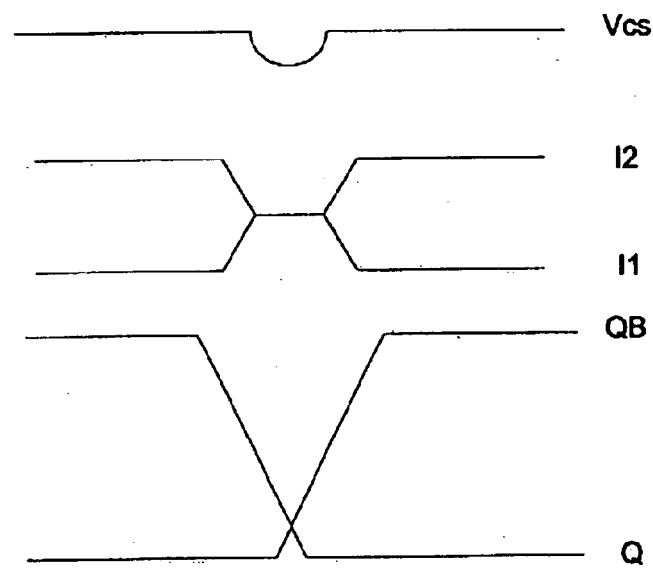
FIG. 2 shows timing charts of control signals with non-overlap timing, which are used to control the current-type DAC cell circuit of FIG. 1.
Figure 3:
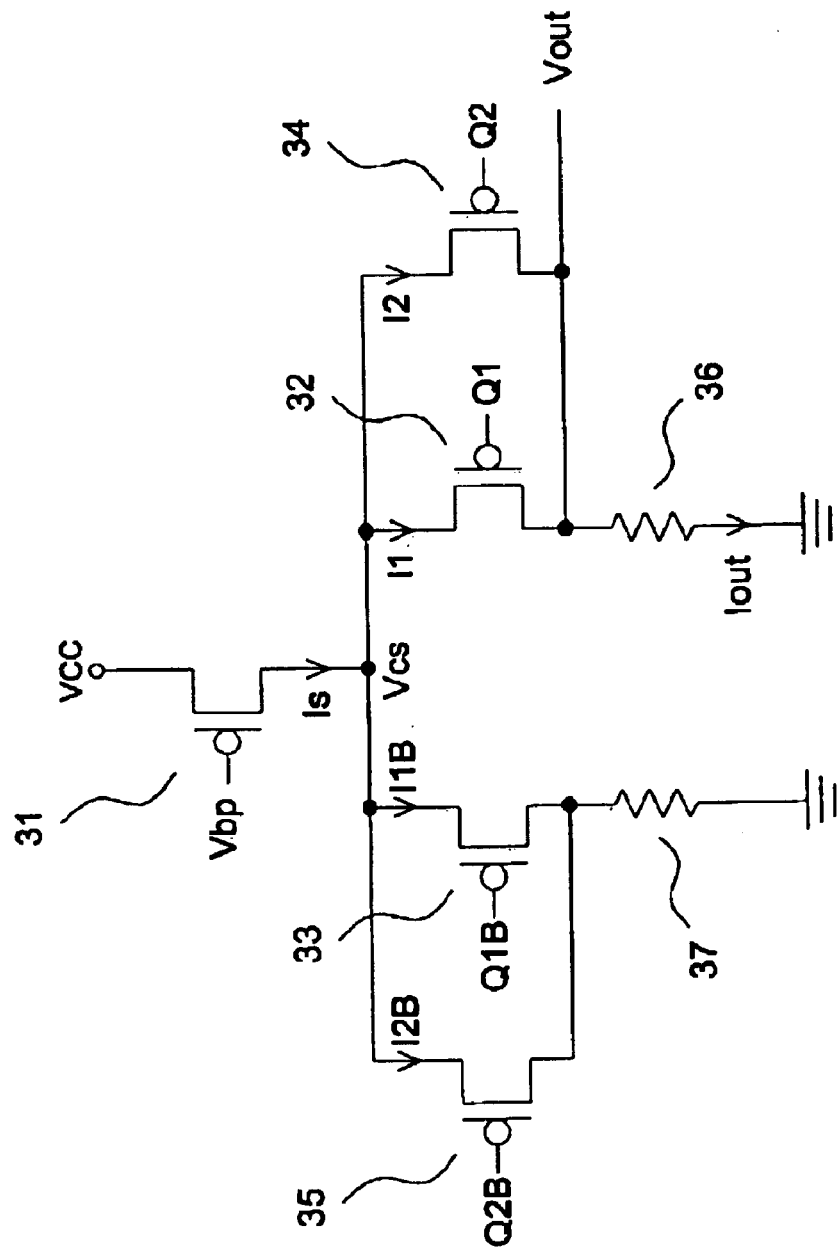
FIG. 3 shows a DAC cell circuit of the present invention.
Figure 4:
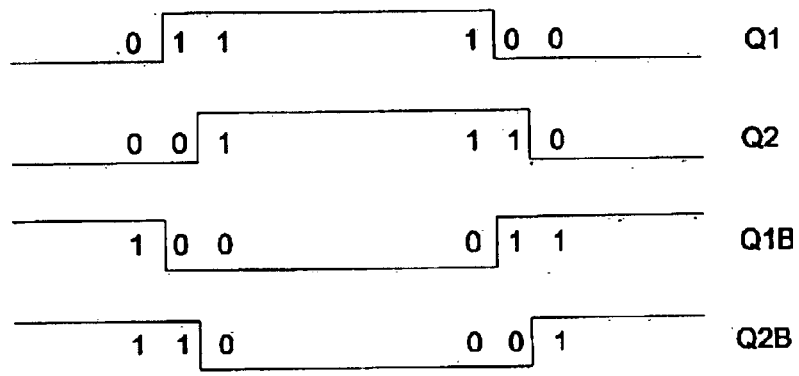
FIG. 4 shows timing charts of control signals with delayed timing, which are used to control the current-type DAC cell circuit of the invention.

FIG. 3 shows a DAC cell circuit according to the present invention. As shown in FIG. 3, the DAC cell circuit includes a PMOSFET 31 and a set of PMOSFETs 32, 33, 34 and 35. The PMOSFET 31 is controlled by a signal Vbp with constant voltage and serves as a constant current source to provide a constant current for the DAC cell circuit. The PMOSFETs 32 to 35 serve as 2 pairs of current switches, wherein the four PMOSFETs are transistors having the same dimension. The sources of the PMOSFETs 32 to 35 are all connected to the drain of the PMOSFET 31, and the drains of the PMOSFETs 32 to 35 are connected to a pair of resistors 36 and 37. The switching operations of the PMOSFETs 32 to 35 are controlled by control signals Q1, Q1B, Q2 and Q2B, which are respectively input to the gates of the PMOSFETs 32 to 35. The control signals Q1, Q1B, Q2 and Q2B are a set of control signals with delay timing control. As shown in FIG. 4, the control signal Q2 is a delayed control signal of the control signal Q1, and the control signals Q1B and Q2B are reverse signals of the control signals Q1 and Q2, respectively.

Figure 5:
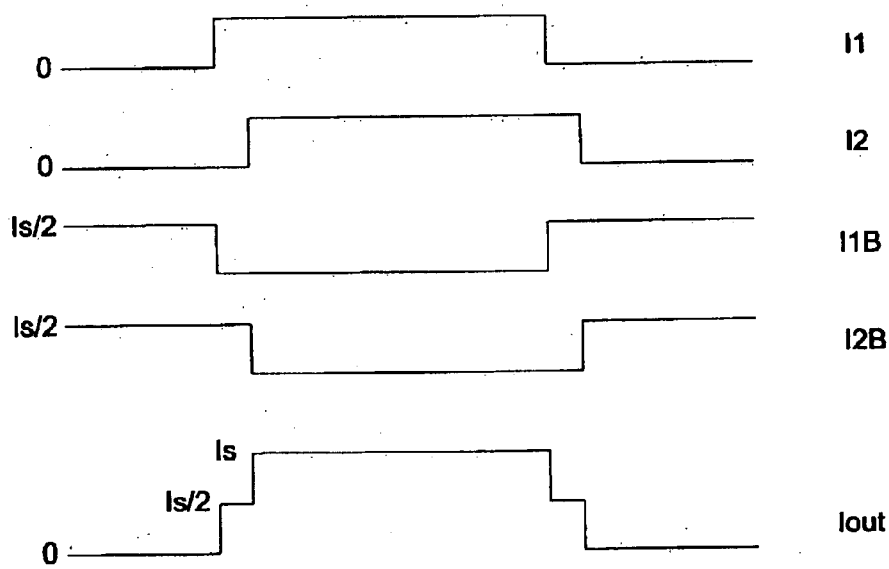
FIG. 5 shows current waveforms of some of the transistors and resistors.

FIG. 5 shows current waveforms of some of the transistors and resistors. The operating principle of the DAC cell circuit will be described with reference to FIGS. 4 and 5. It is assumed that the initial states of the control signals Q1 and Q2 are High, and the initial states of the control signals Q1B and Q2B are Low. The PMOSFET 31 controlled by the signal Vbp with constant voltage serves as a constant current source to provide a constant current Is for the DAC cell circuit. Therefore, the currents I1B and I2B flowing through the PMOSFETs 33 and 35 are Is/2. When current will be switched from dummy load resistor 37 to output resistor 36, first the control signal Q1 is changed from High to Low, and the PMOSFET 32 is turned ON. Meanwhile, the control signal Q1B is changed from Low to High, and the PMOSFET 33 is turned OFF. At this moment, the original current I1B flowing through the PMOSFET 33 is reduced from Is/2 to 0, and the current I1 of the PMOSFET 32 is increased to Is/2. Since the PMOSFETs 32 and 33 are changed their switching states, the current Iout flowing through the resistor 36 of the DAC cell circuit is changed from 0 to Is/2. Thus, only half of the output voltage is translated to Vout. After a predetermined period of delay time, the control signal Q2 is also changed from High to Low, and the PMOSFET 34 is turned ON thereby. Meanwhile, the control signal Q2B is changed from Low to High, and the PMOSFET 35 is turned OFF thereby. At this moment, the original current I2B flowing through the PMOSFET 35 is changed from Is/2 to 0, and the current I2 of the PMOSFET 34 is increased to Is/2. Since the PMOSFETs 34 and 35 are changed their switching states, the current Iout flowing through the resistor 36 of the DAC cell circuit is further changed from Is/2 to Is, and then the conversion operation of the DAC unit circuit is completed.

In the embodiment of the invention, the DAC cell circuit utilizes a delay control circuit (not shown) to generate a set of control signals with delay timing control, which are used to control the transistors of the current switches, thus when current switching from dummy load to output, $1^{st}$ half current is translated to output and then through a delay the other half is translated. The slew rate of its output current is controlled by way of the timing delay. It can be understood that the operation currents flowing through each transistor are the same current Is/2 during the current switching process of the DAC unit circuit, such that the voltage vibration of the common source node is minimized during the switching operations of each transistor. Also, since the DAC cell circuit controls the switching of each transistor in a stage-by-stage manner (i.e., the output current during the converting process is output in a stage-by-stage manner), the slew rate of the output current may be controlled.

Consequently, the DAC cell circuit of the invention only utilizes a set of control signals with delayed timing to switch the transistors of the current switches, respectively, such that the voltage vibrations caused in the digital-to-analog current switching process may be minimized. Also, the output voltage may quickly reach the stable potential without using the control signals with non-overlap timing. Meanwhile, controlling the slew rate of the output current may minimize the inductance induced L di/dt noises of the output current caused in the digital-to-analog converting process.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A DAC cell circuit, comprising:
   a constant current source for providing a constant current;
   a first resistor;
   a second resistor;
   a first MOSFET having a first source connected to the constant current source, a first drain connected to the first resistor, and a first gate for receiving a first control signal;
   a second MOSFET having a second source connected to the constant current source and the first source of the first MOSFET, a second drain connected to the second resistor, and a second gate for receiving a second control signal;
   at least one third MOSFET having a third source and a third drain connected to the first source and first drain of the first MOSFET, respectively, and a third gate for receiving a third control signal; and
   at least one fourth MOSFET having a fourth source and a fourth drain connected to the second source and second drain of the second MOSFET, respectively, and a fourth gate for receiving a fourth control signal.

2. The DAC cell circuit according to claim 1, wherein the first, second, third and fourth MOSFETs have the same W/L ratio.

3. The DAC cell circuit according to claim 1, wherein the constant current source comprises a fifth MOSFET having a fifth drain connected to the first and second sources of the first and second MOSFETs, and a fifth gate controlled by a signal with constant bias voltage.

4. The DAC cell circuit according to claim 1, wherein the third control signal is a delayed signal of the first control signal.

5. The DAC cell circuit according to claim 4, wherein the fourth control signal is a delayed signal of the second control signal.

6. The DAC cell circuit according to claim 5, wherein the second control signal is reverse to the first control signal.

* * * * *